(12) United States Patent
Salamati-Saradh et al.

(10) Patent No.: US 6,395,102 B1
(45) Date of Patent: May 28, 2002

(54) METHOD AND APPARATUS FOR IN-SITU RETICLE CLEANING AT PHOTOLITHOGRAPHY TOOL

(75) Inventors: Sima Salamati-Saradh, Plano; Richard L. Guldi, Dallas; David R. Wyke, McKinney, all of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/139,420

(22) Filed: Aug. 25, 1998

Related U.S. Application Data

(60) Provisional application No. 60/056,772, filed on Aug. 25, 1997.

(51) Int. Cl.$^7$ .............................. B08B 7/00; B08B 7/04
(52) U.S. Cl. .............................. 134/37; 134/1; 134/1.3; 134/21; 134/34; 134/902; 15/345; 15/404
(58) Field of Search .................. 15/404, 406, 345, 15/310; 134/1, 1.3, 21, 34, 36, 37, 18, 57 R, 95.1, 155, 186, 902

(56) References Cited

U.S. PATENT DOCUMENTS

| | | | | |
|---|---|---|---|---|
| 4,437,479 A | * | 3/1984 | Bardina et al. | 134/68 |
| 4,483,040 A | * | 11/1984 | Magee et al. | 15/302 |
| 4,694,527 A | * | 9/1987 | Yoshizawa | 15/308 |
| 5,022,419 A | * | 6/1991 | Thompson et al. | 134/102 |
| 5,221,360 A | * | 6/1993 | Thompson et al. | 134/33 |
| 5,544,421 A | * | 8/1996 | Thompson et al. | 34/58 |
| 5,571,337 A | * | 11/1996 | Mohindra et al. | 134/25.4 |
| 5,839,455 A | * | 11/1998 | Turner et al. | 134/57 R |
| 5,846,338 A | * | 12/1998 | Bonora et al. | 134/37 X |

FOREIGN PATENT DOCUMENTS

JP          6-168864          *    6/1994

OTHER PUBLICATIONS

Webster's New International Dictionary, p. 2577, 1940.*

* cited by examiner

Primary Examiner—Alexander Markoff
(74) Attorney, Agent, or Firm—Wade James Brady III; Frederick J. Telecky, Jr.

(57) ABSTRACT

A method and system for cleaning a reticle. There is provided a clean chamber and a reticle having a pair of opposing edges and a pair of opposing surfaces which is to be cleaned disposed in the clean chamber. A gas inert to the reticle is directed in a direction tangential to each of the surfaces of the reticle and along one the edge of the reticle. The gas is exhausted from a location spaced from the other of the pair of opposing edges and remote form the one edge. An optional monitor monitors the particles in the exhausted gas. The gas is preferably applied in pulses which have a pulse length of from about 0.05 second to about 1 second and a pulse repetition rate of from about 0.5/second to about 40/second. The gas is preferably ionized and preferably is applied at a pressure of from about 20 psi to about 120 psi. The stepper chamber is vibrationally isolated from the blow-off chamber. Also, the controller for the cleaning operation is synchronized with the stepper operation to avoid cleaning while the stepper operation is ongoing.

22 Claims, 1 Drawing Sheet

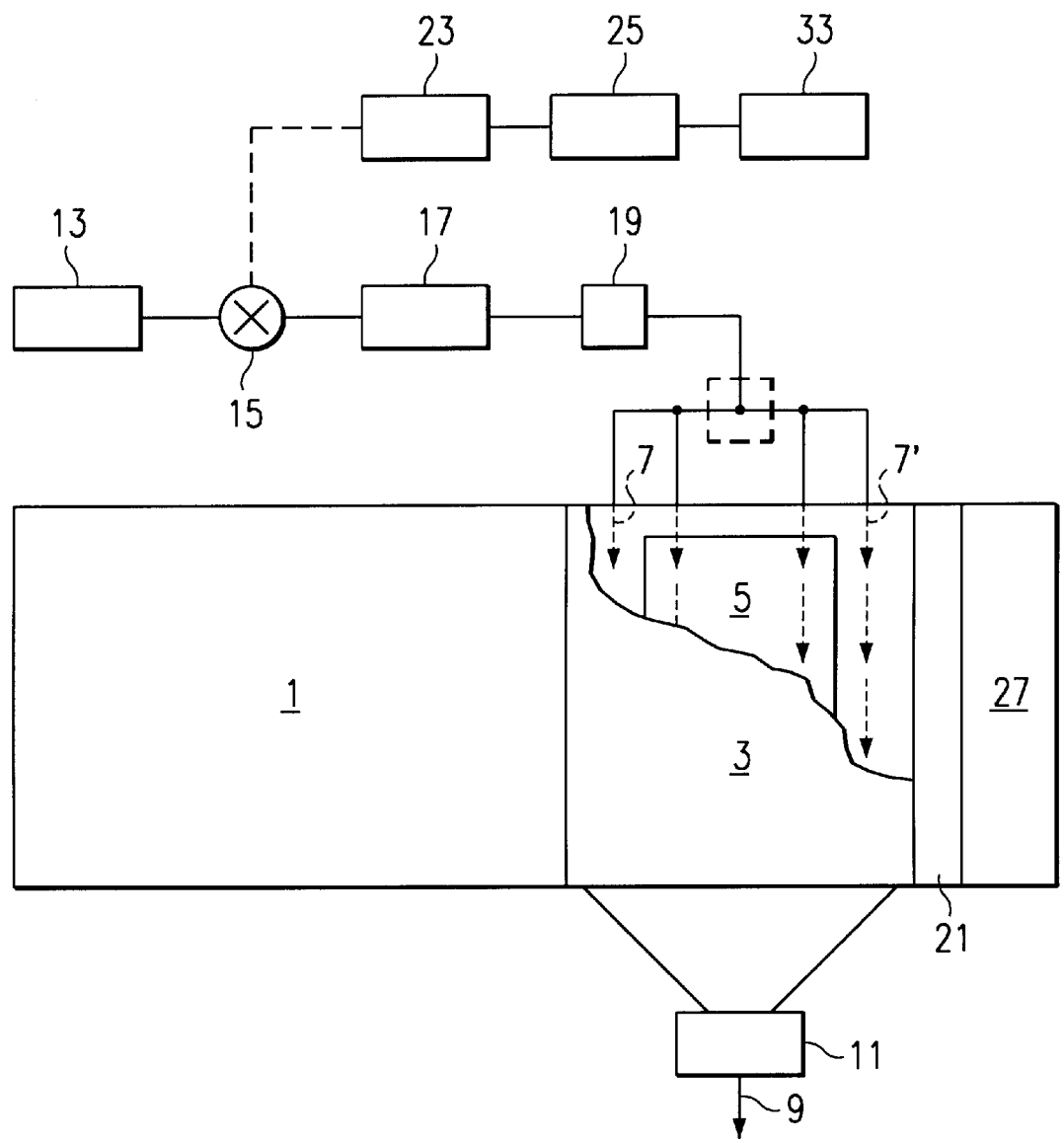

METHOD AND APPARATUS FOR IN-SITU RETICLE CLEANING AT PHOTOLITHOGRAPHY TOOL

CROSS REFERENCE TO PRIOR APPLICATIONS

This application claims priority under 35 USC §119(e)(1) of provisional application No. 60/056,772 filed Aug. 25, 1997.

This application is related to Ser. No. 08/422,331, filed Apr. 13, 1995 and Ser. No. 60/032,894, filed Dec. 13, 1996, the contents of both of which are incorporated herein by reference.

BACKGROUND OF THE INVENTION

1. Field of the Invention

This invention relates to a method of cleaning reticles for use in conjunction with the fabrication of semiconductor devices.

2. Brief Description of the Prior Art

In the manufacture of semiconductor devices, a plurality of reticles are generally required with each reticle providing the basic pattern for each level of the semiconductor device. A problem generally arises whereby contamination or particles are deposited on the reticle and thereby cause a pattern somewhat different from the intended pattern to be formed on the semiconductor device. In fact, with the continued miniaturization of semiconductor components in integrated circuits, often a speck of dirt from the air which may be too small to be noticed can land on the reticle and cause a fatal defect in the finally fabricated device such as, for example, a short circuit or an open circuit.

In order to avoid the above described problem, the reticles have been stored in boxes. When required, the reticle was removed from the box and inspected under very bright light to determine whether specks of dirt were contained on the reticle. The dirt was then blown off of the reticle using a nitrogen gun. This involved holding the reticle and attempting to maintain the reticle clean while also blowing off any dirt contained on the reticle. The reticle was then replaced in the box. An additional optional step included cleaning out of the box with the nitrogen gun to minimize the possibility of contamination of the reticle within the box itself. The reticles were then stored in the boxes in a reticle library which is a closed clean container. When required to be used, the reticles are removed from the boxes in the reticle library, entered into a stepper where they are used to form one or more patterns during processing of a semiconductor device and are then returned to the box in the reticle library.

It is apparent that it desirable to maintain the reticles as clean as possible, with cleanliness being enhanced by removal of the human handling factor to the greatest extent possible.

SUMMARY OF THE INVENTION

The above-described problem of the prior art is minimized and there is provided a system and process for in-situ cleaning of the reticles by blow cleaning the reticles in an apparatus designed for such cleaning without the human handling element being involved.

Briefly, the above is accomplished by moving the single reticle to be used from the reticle library using automated equipment as in the prior art for reticle movement to a reticle blow-off chamber. The reticle blow-off chamber is attached to the reticle library in a manner to restrict the entry of any contaminants from the exterior into the chamber. A gas which is inert to the materials on the reticle, preferably nitrogen, is then pulsed, preferably tangentially to the reticle surfaces and over the surface of the reticle to an exhaust. The gas jet through which the gas is injected into the blow-off chamber is designed to force the gas along the surface of the reticle along the entire length of the reticle and on both sides of the reticle. Jet configurations can be, for example, a single jet along the entire length of the reticle with a width sufficient to inject air on both sides of the reticle or two such jets, each jet designed to inject air against one of the sides of the reticle. Another jet configuration can be to provide a plurality of jets along the entire upper edge of the reticle with each such jet either injecting gas on both sides of the reticle or with each jet being split in half or being two jets so that each half injects gas on only one side of the reticle.

It has been determined in accordance with the present invention that the removal of dirt from the surface of the reticle is materially enhanced by a rapid pulsing action of the gas and that a rapid pulsing action, from about 0.5 second up to about 1 second pulse length. The pressure of the gas is from about 20 psi to about 120 psi and preferably about 80 psi and is sufficient to dislodge the dirt from the reticle with great speed and efficiency. The pulse repetition rate of the applied gas is from about 0.5/second to about 40/second. The gas is preferably ionized.

The cleaning gas, which is preferably nitrogen, is filtered to remove any particles therein and is then ionized prior to entry into the blow-off chamber to prevent static charge from being accumulated on the reticle. Static charge would cause the reticle to attract new contamination from the environment. A valve or other appropriate mechanism to provide a pulsing action to the gas entering the blow-off chamber is provided. The valve is controllable externally to allow for changes and control of pulse length as well as the interval between pulses. The valve or other appropriate mechanism is provided to control the pressure of the gas applied to the reticle being cleaned. A typical ionization source uses alpha particles to electrically neutralize the injected nitrogen stream. Ionization can take place anywhere within the nitrogen source line up to entry into the blow-off chamber or within the blow-off chamber by means of injection of ions within the box adjacent to the injected nitrogen stream and preferably taking place immediately before entry into the blow-off chamber or within the chamber at the point of injection.

The blow-off chamber preferably has a groove for holding the reticle in a vertical position and a series of nitrogen jets in the top of the blow-off chamber to pulse the gas in a direction along or tangential to the surfaces of the reticle. An exhaust for the gas with any particles dislodged from the reticle is positioned at the bottom of the blow-off chamber. An in situ particle monitor (ISPM) can be located in the exhaust to monitor the existence of particles in the exhaust. The ISPM shines a laser across the path that particles would take in the exhaust and scatters light whenever the laser beam strikes a particle. A light detector is positioned normal to the path of the laser beam and therefore only receives light when there is a scattering of the light from the laser beam which indicates that particles are still present in the exhaust and that the reticle is not fully cleaned. Cleaning therefore continues until no particles are sensed for some predetermined period of time or until the particle count per unit of time is below some predetermined value, depending on the degree of cleaning required.

After the reticle is cleaned in the blow-off chamber by virtue of the ISPM having reached a count of zero or other predetermined minimum value, the reticle is then automatically positioned in the stepper using the automated equipment of the prior art and the reticle is returned to the reticle library for reuse after its task within the stepper has been completed.

As an alternative, the ISPM can be used periodically by being inserted into one cleaning line on a continuous or part time basis to determine the optimum cleaning time, which presently appears to be about 10 to about 20 seconds. This time can be used and updated in all systems without using the ISPM on a continual basis and/or in all lines.

It can be seen that there has been provided a system and procedure for cleaning reticles which insures that the reticle is cleaned immediately prior to each use. Such cleaning is accomplished in a clean environment and without the intrusion of a human operator in the cleaning environment.

BRIEF DESCRIPTION OF THE DRAWINGS

Referring to the FIGURE, there is shown a reticle cleaning system in accordance with the present invention.

DESCRIPTION OF THE PREFERRED EMBODIMENT

Referring to the FIGURE, there is shown a reticle storage or library 1 for storing reticles either in cassettes or singly as in the prior art. The reticle library 1 is maintained as a clean area by semiconductor processing standards. The reticle library 1 is coupled to a blow-off chamber 3 in a manner to maintain the clean area and prevent any particles to enter the area from the external environment. The reticle 5 is positioned vertically within the chamber 3 with gas jets 7 positioned in the upper surface of the chamber and an exhaust 9 being disposed below the reticle. Gas flow is from the gas jets 7 to the exhaust 9. An ISPM 11 is disposed in the exhaust region 9 to monitor the exhaust gas for particles with the reticle being retained in the blow-off chamber until the particle count in the ISPM has reached a predetermined value per predetermined period of time. A vibration isolation system 21 is disposed between the blow-off chamber 3 and the stepper chamber 27 to prevent vibrations from reaching the delicate stepper chamber. It is desired to minimize any chance of jeopardizing the stepper alignment system.

The gas, preferably nitrogen, is passed from a nitrogen-containing tank 13 to a controllable nitrogen injector valve 15 which can be externally controlled and which can determine the pulse rate, if pulsed, of the gas emanating therefrom as well as the gas volume per unit of time to control the pressure of the gas at the jets 7. A preferred set of parameters for the nitrogen injection is a pulse length of 0.5 second with a pulse repetition rate of 5 pulses per second at a pressure of about 80 psi. The gas is then filtered in filter 17 to remove any particles which may be present with the gas then being ionized in an ionizer 19 which is preferably located to cause ionization immediately prior to gas entry into the jets 7. Nitrogen injector valve 15 is connected electrically to a blow-off chamber controller computer 23, which itself communicates with stepper controller computer 25. Reticle cleaning is not allowed during the actual pattern printing step in order to prevent pattern distortion in the wafer due to vibration not attenuated by the vibration isolation system 21.

In operation, a particular reticle will be addressed in the reticle library 1 and pass along a path into the blow-off chamber 3 where it will be positioned in a vertical manner. The reticle storage 1 will then preferably be closed off from the blow-off chamber 3 and the valve 15 will be operated to cause nitrogen from the nitrogen-containing tank 13 to pass through the valve with a predetermined pulse length and predetermined repetition rate to the filter 17 where particles are removed from the gas. The gas is then ionized in an ionizer 19 and passed through jets 7 tangentially along the surfaces of the reticle 5. The exhaust gas travels to the exhaust region 9 and is monitored by the ISPM 11. When the particle count per unit of time as monitored by the ISPM 11 reaches a predetermined value, the reticle 5 is moved into the stepper 21 for use and then returned to the reticle library 1.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of cleaning a reticle which comprises the steps of:
    (a) placing a reticle having a pair of opposing edges and a pair of opposing surfaces which is to be cleaned in a clean chamber;
    (b) applying a gas inert to said reticle in a direction along and substantially parallel to each of the surfaces of said reticle and against one of said opposing edges of said reticle and travelling in a direction toward the other of said opposing edges;
    (c) exhausting said gas from a location disposed beyond said reticle in the direction of travel of said gas, spaced from the other of said pair of opposing edges and remote from said one said edge;
    (d) measuring the particle count in the exhausted gas;
    (e) placing said reticle in a stepper for use when the measured particle count reaches a predetermined range; and
    ceasing said steps (a) to (c) while said stepper is in use.

2. The method of claim 1 wherein said gas is applied in pulses.

3. The method of claim 2 wherein said pulses have a pulse length of from about 0.05 seconds to about 1 second and a pulse repetition rate of from about 0.5/second to about 40/second.

4. A method of cleaning a reticle which comprises the steps of:
    (a) placing a reticle having a pair of opposing edges and a pair of opposing surfaces which is to be cleaned in a clean chamber;
    (b) applying an ionized gas inert to said reticle in a direction along and substantially parallel to each of the surfaces of said reticle and against one of said opposing edges of said reticle;
    (c) exhausting said gas from a location spaced from the other of said pair of opposing edges and remote from said one said edge;
    (d) measuring the particle count in the exhausted gas;
    (e) placing said reticle in a stepper for use when the measured particle count reaches a predetermined range; and
    (f) ceasing said steps (a) to (c) while said stepper is in use.

5. The method of claim 4 wherein said gas is applied in pulses.

6. The method of claim 5 wherein said pulses have a pulse length of from about 0.05 seconds to about 1 second and a pulse repetition rate of from about 0.5/second to about 40/second.

7. The method of claim 1 wherein the pressure of said gas is from about 20 psi to about 120 psi.

8. The method of claim 2 wherein the pressure of said gas is from about 20 psi to about 120 psi.

9. The method of claim 4 wherein the pressure of said gas is from about 20 psi to about 120 psi.

10. The method of claim 6 wherein the pressure of said gas is from about 20 to about 120 psi.

11. The method of claim 1 further including the step of measuring the number of particles in the exhausted gas with a particle monitor system and terminating cleaning of said reticle responsive to the measurement of the number of particles monitored diminishes to or below some predetermined number of particles per predetermined unit of time.

12. The method of claim 11 further including the step of removing said particle monitor and then conducting said cleaning of reticles on a cleaning time basis for each reticle determined by said particle monitor system.

13. A method of cleaning a reticle which comprises the steps of:
   (a) providing a reticle storage having a plurality of reticles stored therein;
   (b) providing a clean chamber;
   (c) moving a reticle having a pair of opposing edges and a pair of opposing surfaces which is to be cleaned by automated equipment from said reticle storage chamber to said clean chamber;
   (d) applying a gas inert to said reticle in a direction along and substantially parallel to each of the surfaces of said reticle and against one of said opposing edges of said reticle;
   (e) exhausting said gas from a location spaced from the other of said pair of opposing edges and remote from said one said edge;
   (f) moving said reticle into a stepper for semiconductor fabrication and ceasing operation in said clean chamber during semiconductor fabrication with said reticle;
   (g) returning said reticle to said reticle storage; and
   (h) commencing cleaning of a further reticle in said clean chamber.

14. The method of claim 13 wherein said gas is applied in pulses.

15. The method of claim 14 wherein said pulses have a pulse length of from about 0.5 seconds to about 1 second and a pulse repetition rate of from about 0.5/second to about 40/second.

16. The method of claim 13 wherein said gas is ionized.

17. The method of claim 14 wherein said gas is ionized.

18. The method of claim 15 wherein said gas is ionized.

19. The method of claim 13 wherein the pressure of said gas is from about 20 psi to about 120 psi.

20. The method of claim 14 wherein the pressure of said gas is from about 20 psi to about 120 psi.

21. The method of claim 16 wherein the pressure of said gas is from about 20 psi to about 120 psi.

22. The method of claim 18 wherein the pressure of said gas is from about 20 psi to about 120 psi.

* * * * *